United States Patent
Chen

(10) Patent No.: US 11,224,143 B2
(45) Date of Patent: Jan. 11, 2022

(54) CHARGING PILE

(71) Applicant: Delta Electronics, Inc., Taoyuan (TW)

(72) Inventor: Chieh-Kai Chen, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 251 days.

(21) Appl. No.: 16/671,938

(22) Filed: Nov. 1, 2019

(65) Prior Publication Data

US 2020/0383234 A1    Dec. 3, 2020

(51) Int. Cl.
| | |
|---|---|
| *H02J 7/00* | (2006.01) |
| *H05K 7/20* | (2006.01) |
| *H05K 5/06* | (2006.01) |
| *B60L 53/302* | (2019.01) |

(52) U.S. Cl.
CPC ........ *H05K 7/20163* (2013.01); *H02J 7/0042* (2013.01); *H05K 5/061* (2013.01); *B60L 53/302* (2019.02); *B60Y 2200/91* (2013.01)

(58) Field of Classification Search
USPC ................. 320/105, 106, 107, 108, 109, 110
See application file for complete search history.

(56) References Cited

U.S. PATENT DOCUMENTS

2008/0053316 A1    3/2008    Kim

FOREIGN PATENT DOCUMENTS

| CN | 204290403 U |   | 4/2015 |
|---|---|---|---|
| CN | 206376348 U |   | 8/2017 |
| CN | 206442655 U | * | 8/2017 |
| CN | 108430191 A | * | 8/2018 |
| CN | 108544966 A | * | 9/2018 |
| CN | 207931514 U | * | 10/2018 |
| CN | 109228944 A | * | 1/2019 |
| CN | 109599923 A | * | 4/2019 |
| CN | 109941142 A | * | 6/2019 |
| CN | 209240908 U | * | 8/2019 |
| CN | 209462062 U | * | 10/2019 |
| CN | 209521570 U | * | 10/2019 |
| JP | 2011194522 A |   | 10/2011 |
| TW | M415882 U |   | 11/2011 |
| TW | M480529 U |   | 6/2014 |

* cited by examiner

*Primary Examiner* — Brian Ngo
(74) *Attorney, Agent, or Firm* — Kirton McConkie; Evan R. Witt

(57) ABSTRACT

The present disclosure provides a charging pile including a supporting device, a control module and a power module. The control module is fixed on the supporting device and includes a first housing, a control unit and a waterproof device. The first housing has a first opening. The waterproof device is disposed on and surrounding around the periphery of the first opening. The power module is fixed on the supporting device and disposed on the top of the control module. The power module includes a second housing and a power supply unit. The second housing has a second opening, which is in communication with the first opening of the first housing. The control unit is electrically coupled with the power supply unit. The waterproof device is disposed between the first housing and the second housing, and surrounding around the periphery of the first opening and the periphery of the second opening.

12 Claims, 8 Drawing Sheets

CHARGING PILE

FIELD OF THE INVENTION

The present disclosure relates to a power supply device, and more particularly to a charging pile.

BACKGROUND OF THE INVENTION

With the development of the automobile industry, problems such as environmental pollution and energy shortage have gradually become an urgent issue to be addressed. Electric vehicles have the advantages of environmental protection and energy saving, so they have gradually been developed and promoted to replace traditional fuel vehicles. In recent years, the quantity of electric vehicles has increased rapidly, which has led to an increase in the demand for electric charging devices or charging piles. Therefore, charging piles have become a focus of research and development.

At present, a current charging pile for charging an electric vehicle is a single device, which includes a single housing and a circuit board assembly. The housing has an accommodating space, and a plurality of openings are disposed on the two sides of the housing, respectively. The circuit board assembly is mounted through one of the openings and disposed within the accommodating space of the housing. The housing further includes two water repellent mechanisms, which are mounted on the housing and corresponding in position to the corresponding openings of the housing, respectively, for achieving the purposes of waterproofing and ventilation. However, the current charging pile integrates all functional circuits into a circuit board assembly, and the circuit board assembly is installed inside the single housing. If some circuits or electronic components are damaged or malfunction and need to be repaired or replaced, the water repellent mechanisms on both sides of the housing must be disassembled and the circuit board assembly is removed from the housing through the opening. Therefore, the repairing and maintenance process is complicated and takes a long period of time, and the entire circuit board assembly may need to be replaced during maintenance, so that the maintenance cost is increased. In addition, the current charging pile is a single device that cannot be expanded, and the output power and specifications are immutable, so that only a specific level of output power can be provided. The current charging piles are unable to expand according to the practical requirements, which cause the limitation of application of the charging piles.

If another specific level of output power needs to be provided, the housing and the circuit board assembly of the charging pile must be redesigned. Consequently, the cost of molds, fixtures and manufacturing are increased, and the time for product design and production is also increased. Furthermore, since the current charging pile is a single device, it is difficult to disassemble and transport the charging pile, which may result in higher transportation costs.

On the other hand, the current water repellent mechanism of the charging pile includes a plurality of channels and baffles, and it has the disadvantages of complicated structure, high manufacturing costs and poor waterproof efficiency. Moreover, the water repellent mechanism is mounted on the housing and corresponding in position to the opening by means of screws locking, so that not only the time of assembling and producing is increased, but also the time of repairing is increased. Furthermore, additional locking portions and locking holes need to be employed to the corresponding positions of the housing and the water repellent mechanism. Accordingly, the structure of the housing is more complicated, and it is difficult to align and position the components in the assembling process. Moreover, the screw is easily damaged by rust or fatigue after being used for a long period of time, which causes the difficulty in subsequent disassembly operations.

In addition, when the charging pile is in operation, the circuit board assembly generates a large amount of heat energy due to the power conversion. Since the current charging pile lacks an effective heat dissipation mechanism, the heat dissipation efficiency is low. Consequently, the operation efficiency of the charging piles is affected.

Therefore, there is a need of providing an improved charging pile to obviate the drawbacks of the prior art.

SUMMARY OF THE INVENTION

It is an object of the present disclosure to provide a charging pile to address the issues of complex structure, difficult assembly, high production and maintenance costs, longer maintenance operation time, poor efficiency of waterproofing and heat dissipation, and failing to be expanded according to the practical requirements to reach a higher output power, which are encountered by the prior art.

It is another object of the present disclosure to provide a charging pile. The charging pile includes at least one modular power module and a modular control module so that the advantages of simplifying the structure, reducing the cost of production and maintenance, reducing the time of production, assembly and maintenance, and improving the heat dissipation efficiency are achieved. Moreover, the charging pile can be expanded according to requirements of output power, so that additional time and costs of redesigning are avoided and the scope of application is expanded. In addition, the charging pile further includes a waterproof device which is compressed and disposed between the control module and the power module and is surrounding around the periphery of the openings of the control module and the power module, so that the advantages of improving the waterproof efficiency, simplifying the structure and reducing the time of production, assembly and maintenance are achieved.

In accordance with an aspect of the present disclosure, a charging pile is provided. The charging pile includes a supporting device, a control module and at least one power module. The control module is fixed on the supporting device and includes a first housing, a control unit and at least one waterproof device. The first housing has at least one first opening. The control unit is disposed within the first housing. The at least one waterproof device is disposed on the periphery of the at least one first opening. The at least one power module is fixed on the supporting device and is disposed on the top of the control module. The power module includes a second housing and a power supply unit. The second housing has at least one second opening, and the power supply unit is disposed within the second housing. The at least one second opening of the second housing is in communication with the at least one first opening of the first housing. The control unit is electrically coupled with the power supply unit of each power module. The at least one waterproof device is disposed between the first housing and the second housing and surrounding around the periphery of the at least one first opening and the periphery of the at least one second opening.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
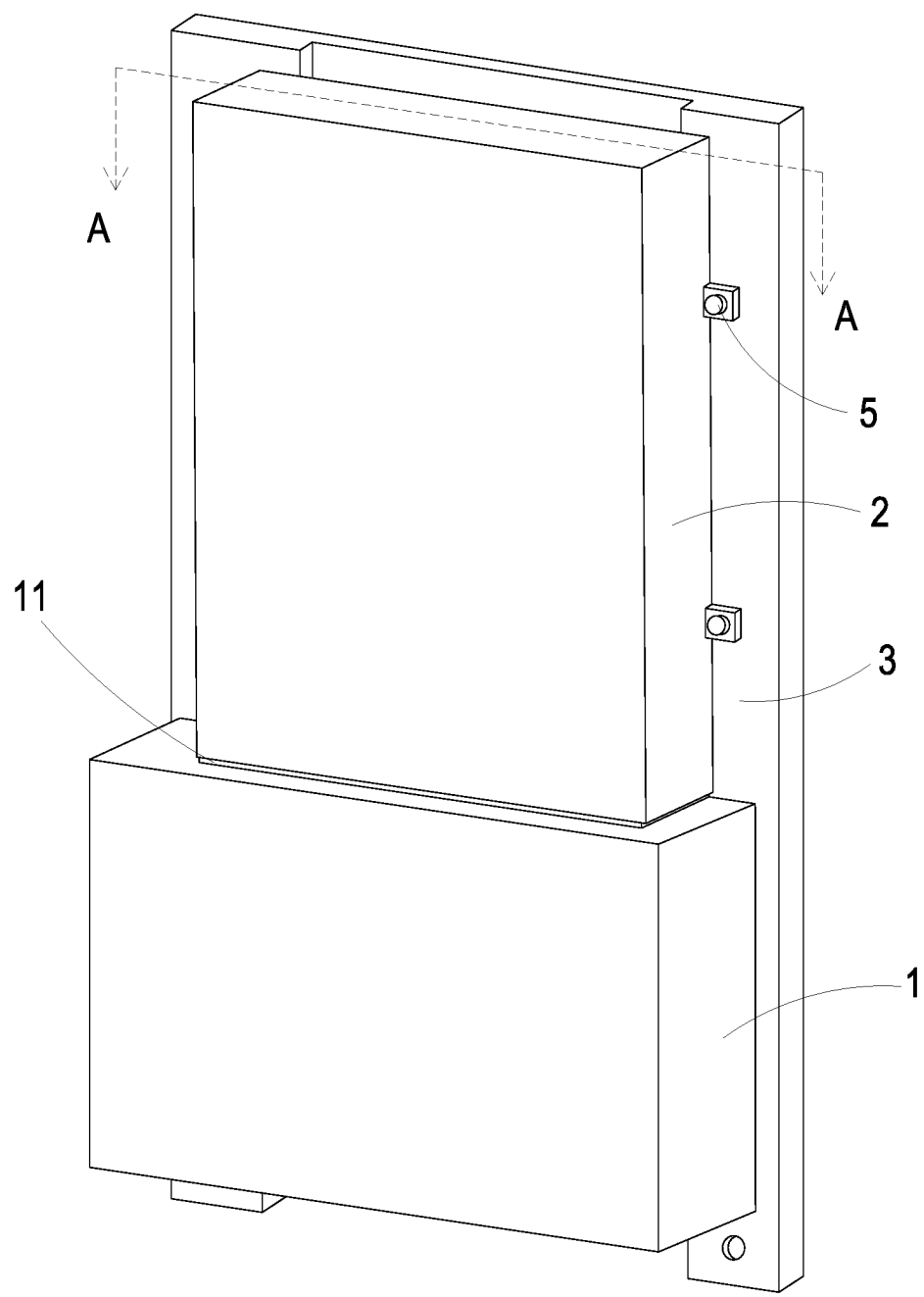
FIG. 1 is a schematic perspective view illustrating a charging pile according to a first embodiment of the present disclosure.
Figure 2:
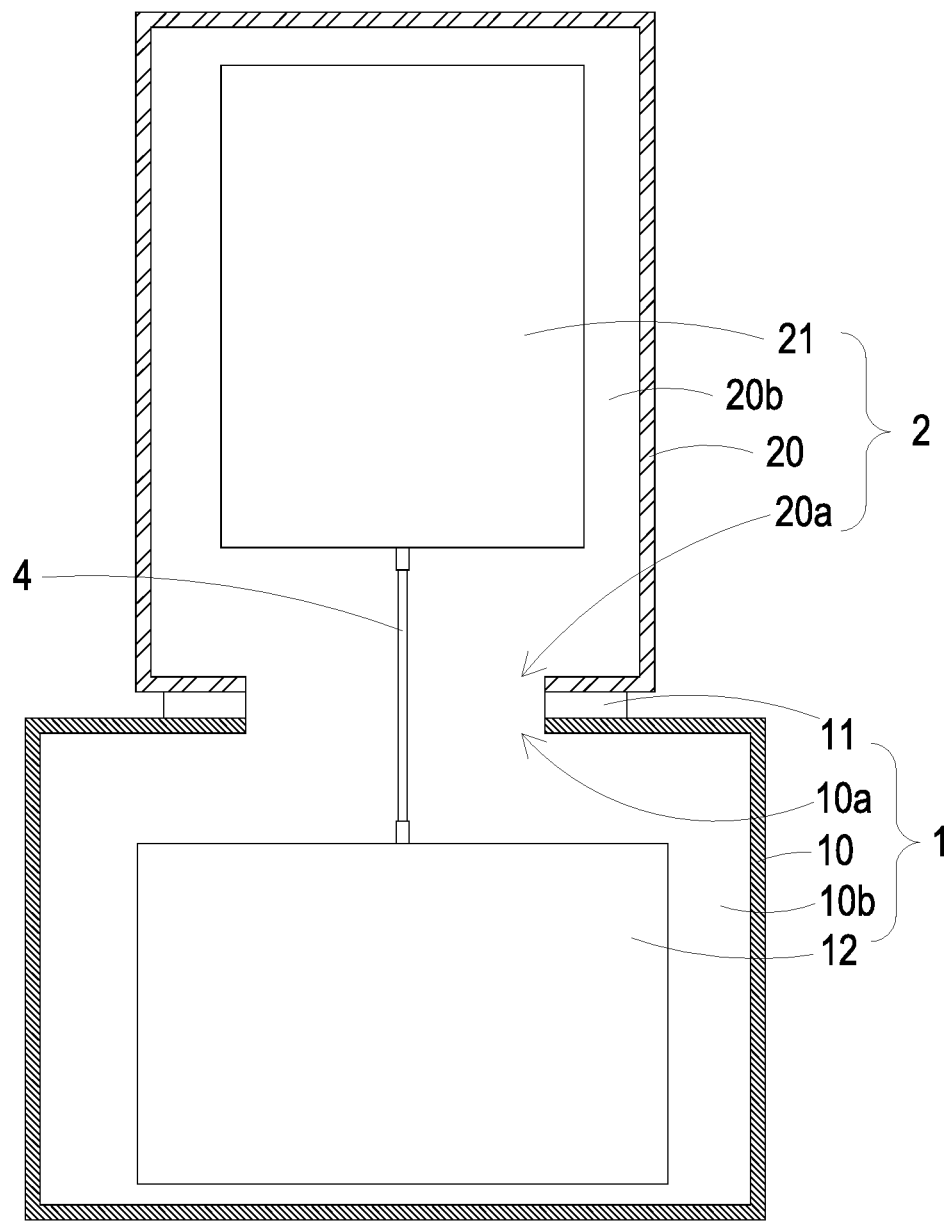
FIG. 2 is a schematic cross-sectional view illustrating the charging pile of FIG. 1 and taken along the line A-A.

FIG. 1 is a schematic perspective view illustrating a charging pile according to a first embodiment of the present disclosure. FIG. 2 is a schematic cross-sectional view illustrating the charging pile of FIG. 1 and taken along the line A-A. In the first embodiment, the charging pile 100 includes a control module 1, a power module 2 and a supporting device 3. The control module 1 includes a first housing 10, a waterproof device 11 and a control unit 12. The first housing 10 has a first opening 10a, and the control unit 12 is disposed within the first housing 10. The waterproof device 11 is disposed on and surrounding around the periphery of the first opening 10a. The power module 2 includes a second housing 20 and a power supply unit 21. The second housing 20 has a second opening 20a, and the power supply unit 21 is disposed within the second housing 20. In the first embodiment, the control module 1 and the power module 2 are modular structures, respectively. The control module 1 and the power module 2 are respectively fixed on the supporting device 3, and the power module 2 is disposed on the top of the control module 1. The second opening 20a of the second housing 20 of the power module 2 is in communication with the first opening 10a of the first housing 10 of the control module 1. The control unit 12 of the control module 1 is electrically coupled with the power supply unit 21 of the power module 2, and the waterproof device 11 is disposed between the first housing 10 and the second housing 20, and is surrounding around the periphery of the first opening 10a and the periphery of the second opening 20a.

In the first embodiment, the power module 2 presses against the control module 1 by gravity so that the power module 2 is disposed on and abuts against the control module 1 and the second opening 20a of the second housing 20 of the power module 2 aligns and is in communication with the first opening 10a of the first housing 10 of the control module 1. The control unit 12 of the control module 1 and the power supply unit 21 of the power module 2 are electrically coupled with each other by a cable 4 passing through the first opening 10a and the second opening 20a. Since the power module 2 presses against and is disposed on the control module 1 by gravity, the waterproof device 11 of the control module 1 is compressed between the first housing 10 and the second housing 20 by the gravity of the power module 2, and is surrounding around the periphery of the first opening 10a and the periphery of the second opening 20a. Consequently, the connection of the first opening 10a of the first housing 10 and the second opening 20a of the second housing is sealed. In this embodiment, the control module 1 and the power module 2 are respectively fixed on the supporting device 3. At least one fastening element 5, for example but not limited to screw, is used to fix the control module 1 and the power module 2 to the supporting device 3 by screw locking. It is noted that the manner which the control module 1 and the power module 2 are fixed to the supporting device 3 is not limited to the foregoing embodiment, and other fastening methods, such as engagement, are also applied to the present disclosure.

In some embodiments, the waterproof device 11 is a flexible waterproof gasket. As the power module 2 presses against the waterproof device 11 of the control module 1 and the control module 1 and the power module 2 are fixed on the supporting device 3 with a constant spaced distance therebetween, the waterproof device 11 is compressed and deformed to seal the connection of the first opening 10a of the first housing 10 and the second opening 20a of the second housing 20. Consequently, the interior of the control module 1 and the interior of the power module 2 are sealed and in communication with each other to form an internal waterproof space. Accordingly, the charging pile 100 of the present disclosure can fix the waterproof device 11 between the control module 1 and the power module 2 by a screwless way and at least IP55 waterproofing and foreign object protection level performance is achieved. Moreover, there is no additional locking portion and locking hole disposed on the first housing 10 of the control module 1 and the second housing 20 of the power module 2 to assemble the waterproof device 11. Consequently, the advantages of simplifying the structure, assembling and disassembling easily and improving the waterproof efficiency are achieved.

In the embodiment, the power supply unit 21 includes a power conversion circuit (not shown in figure). The power conversion circuit includes a circuit board and a plurality of electronic components, for example but not limited to magnetic components, inductors, switching components, capacitors and resistors, etc. The power conversion circuit of the power supply unit 21 receives an input power and converts the input power to an output power so as to provide a specific level of output power. The control unit 12 is configured to control the operation of the power supply unit 21. In this embodiment, the control module 1 and the power module 2 are modular structures, respectively, and the complicated housing structure design is not required, so that the overall structure is simplified, the production cost is reduced, and the production and assembly time are saved. In addition, when a part of the circuit or electronic components of the control module 1 or the power module 2 is damaged or malfunctions, the charging pile 100 can be easily disassembled and only the faulty or damaged module part is needed to be repaired or replaced, so that the maintenance cost and time are reduced. Furthermore, the control module 1 and the power module 2 are modular structures, respectively, so that the power module 2 of the charging pile 100 can be expanded according to the requirements of output power, for example a plurality of power modules 2 can be added into the charging pile 100 to avoid the cost and time of redesigning and expand the scope of application.

In some embodiments, the first housing 10 of the control module 1 includes a first accommodating space 10b for accommodating the control unit 12. The first opening 10a is disposed on one side of the first housing 10. The second housing 20 of the power module 2 includes a second accommodating space 20b for accommodating the power supply unit 21. The second opening 20a is disposed on one side of the second housing 20. A projection area formed by the first opening 10a of the first housing 10 and projected on the side of the second housing 20 is equal to or encompasses the contoured area of the second opening 20a. In other embodiment, the first housing 10 of the control module 1 has a first opening 10a, and the second housing 20 of the power module 2 has a plurality of second openings 20a. The plurality of second openings 20a are disposed on the same side of the second housing 20. A projection area formed by the first opening 10a of the first housing 10 and projected on the side of the second housing 20 is equal to or encompasses the contoured areas of the plurality of second openings 20a. When the power module 2 presses against and is disposed on the control module 1 by gravity, the plurality of second openings 20a of the second housing 20 of the power module 2 are in communication with the first opening 10a of the first housing 10 of the control module 1. Consequently, the interior of the control module 1 and the interior of the power module 2 are in communication with each other and form a waterproof space. By employing the plurality of second openings 20a, when a plurality of cables 4 are required to implement more complicated wiring and routing, the plurality of cables 4 can pass through corresponding second openings 20a, respectively, so as to assist the user in judging the usage of the cables 4 and achieve the purposes of positioning the power module 2 and the control module 1. It is emphasized that the number of the first openings 10a of the first housing 10 and the number of the second openings 20a of the second housing 20 are not limited to the above embodiments, and may be adjusted according to the practical requirements.

Figure 3:
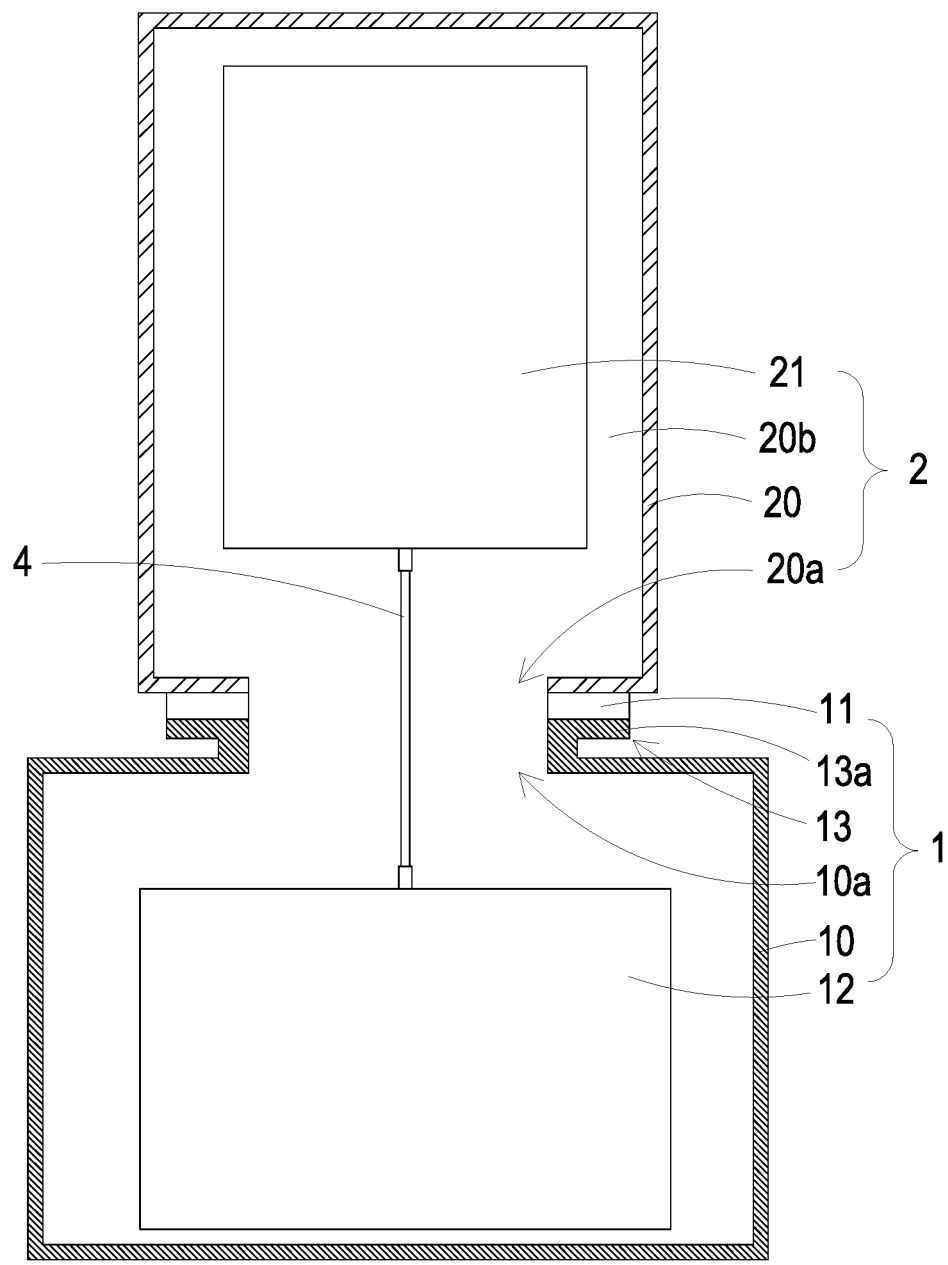
FIG. 3 is a schematic cross-sectional view illustrating the charging pile according to a second embodiment of the present disclosure.

FIG. 3 is a schematic cross-sectional view illustrating the charging pile according to a second embodiment of the present disclosure. The structures and functions of the charging pile 100a of this embodiment are similar to those of the charging pile 100 shown in FIGS. 1 and 2. Component parts and elements corresponding to those of the first embodiment are designated by identical numeral references, and detailed descriptions thereof are omitted. Different from the charging pile 100 shown in FIGS. 1 and 2, in the second embodiment, the first housing 10 of the control module 1 further includes a protrusion 13. The protrusion 13 is surrounding around the periphery of the first opening 10a of the first housing 10 and is extended outwardly from one side of the first housing 10. In the embodiment, the protrusion 13 has a platform 13a, and the waterproof device 11 is disposed on the platform 13a. While the power module 2 and the control module 1 are assembled together, the power module 2 presses against the waterproof device 11 which is disposed on the platform 13a of the control module 1, so that the waterproof device 11 is compressed and deformed to be fixed between the protrusion 13 of the first housing 10 and the second housing 20. In other words, the waterproof device 11 is disposed to surround the periphery of the first opening 10a of the first housing 10 and the periphery of the second opening 20a of the second housing 20, so as to seal the connection of the first opening 10a of the first housing 10 and the second opening 20a of the second housing 20. In addition, by employing the protrusion 13 of the first housing 10, the collision of the power module 2 and the control module 1 during assembling is reduced. Consequently, the convenience of assembling is improved, and the damage caused by collision during assembly is avoided.

Figure 4A:
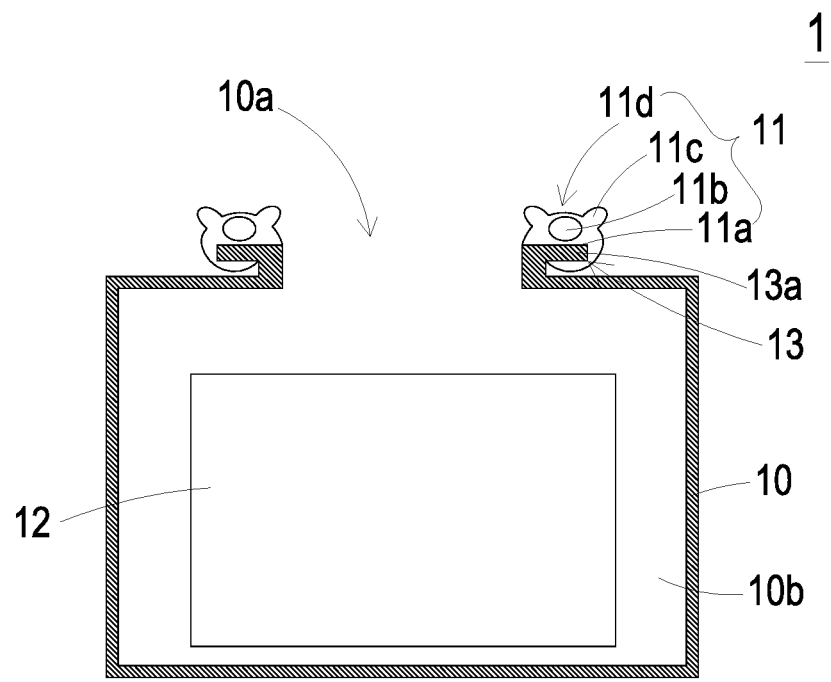
FIG. 4A is a schematic cross-sectional view illustrating an exemplary example of the control module of the charging pile of FIG. 3.
Figure 4B:
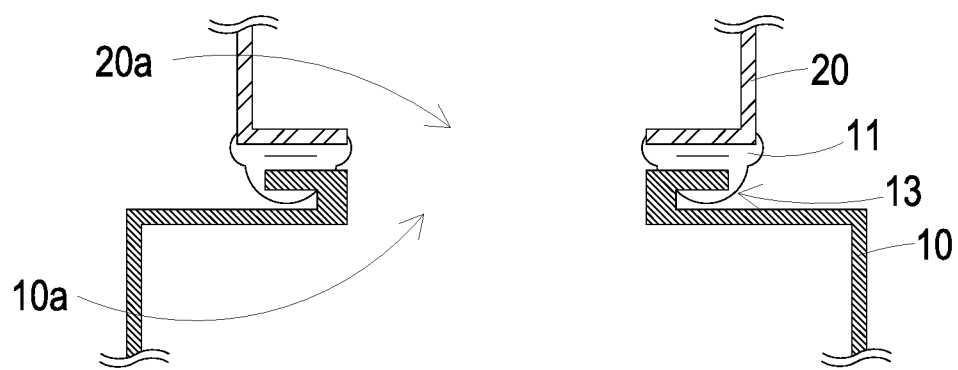
FIG. 4B is a schematic cross-sectional view illustrating the waterproof device of FIG. 4A, wherein the first housing and the second housing are assembled together.

FIG. 4A is a schematic cross-sectional view illustrating an exemplary example of the control module of the charging pile of FIG. 3. FIG. 4B is a schematic cross-sectional view illustrating the waterproof device of FIG. 4A, wherein the first housing and the second housing are assembled together. As shown in FIGS. 3, 4A and 4B, in other embodiments, the waterproof device 11 is a flexible waterproof gasket. Preferably but not exclusively, the flexible waterproof gasket is a rubber gasket. The waterproof device 11 includes an engaging part 11a, a buffer part 11b, at least one extension part 11c and a recess 11d. The waterproof device 11 is disposed on the protrusion 13 of the first housing 10, and the engaging part 11a is engaged with the platform 13a, so that the waterproof device 11 is fixed on the protrusion 13. The buffer part 11b has a hollow structure and is deformed as the power module 2 presses against the waterproof device 11 by gravity. The at least one extension part 11c is extended outwardly from the top of the buffer part 11b, and configured to contact with the second housing 20 of the power module 2. In the embodiment, preferably but not exclusively, the waterproof device 11 has two extension parts 11c. The recess 11d is formed on the top of the buffer part 11b and is adjacent to the two extension parts 11c. Preferably but not exclusively, the recess 11d is located between the two extension parts 11c.

In the embodiment, while the power module 2 presses against the control module 1 by gravity, the buffer part 11b of the waterproof device 11 is compressed and deformed to achieve an effect of cushioning. Consequently, the collision between the components is avoided. Moreover, since the power module 2 presses against the control module 1 by gravity, two extension parts 11c are in contact with the second housing 20 of the power module 2, and the recess 11d of the waterproof device 11 is also in contact with the second housing 20 of the power module 2. Consequently, an air gap between the second housing 20 of the power module 2 and the waterproof device 11 can be avoided, and the waterproof effect can be enhanced.

Figure 5:
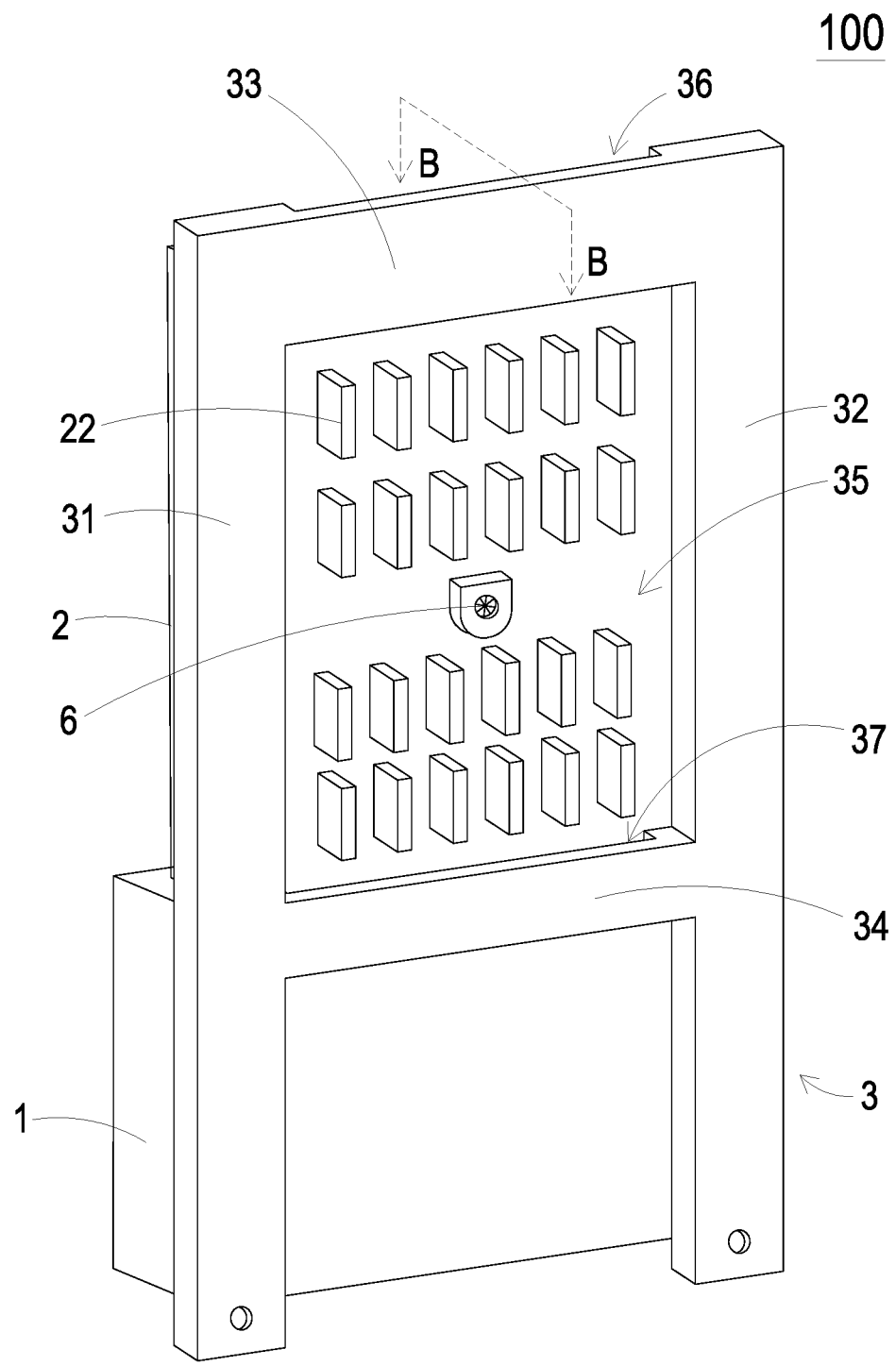
FIG. 5 is a schematic perspective view illustrating a rear of the charging pile of FIG. 1.
Figure 6:
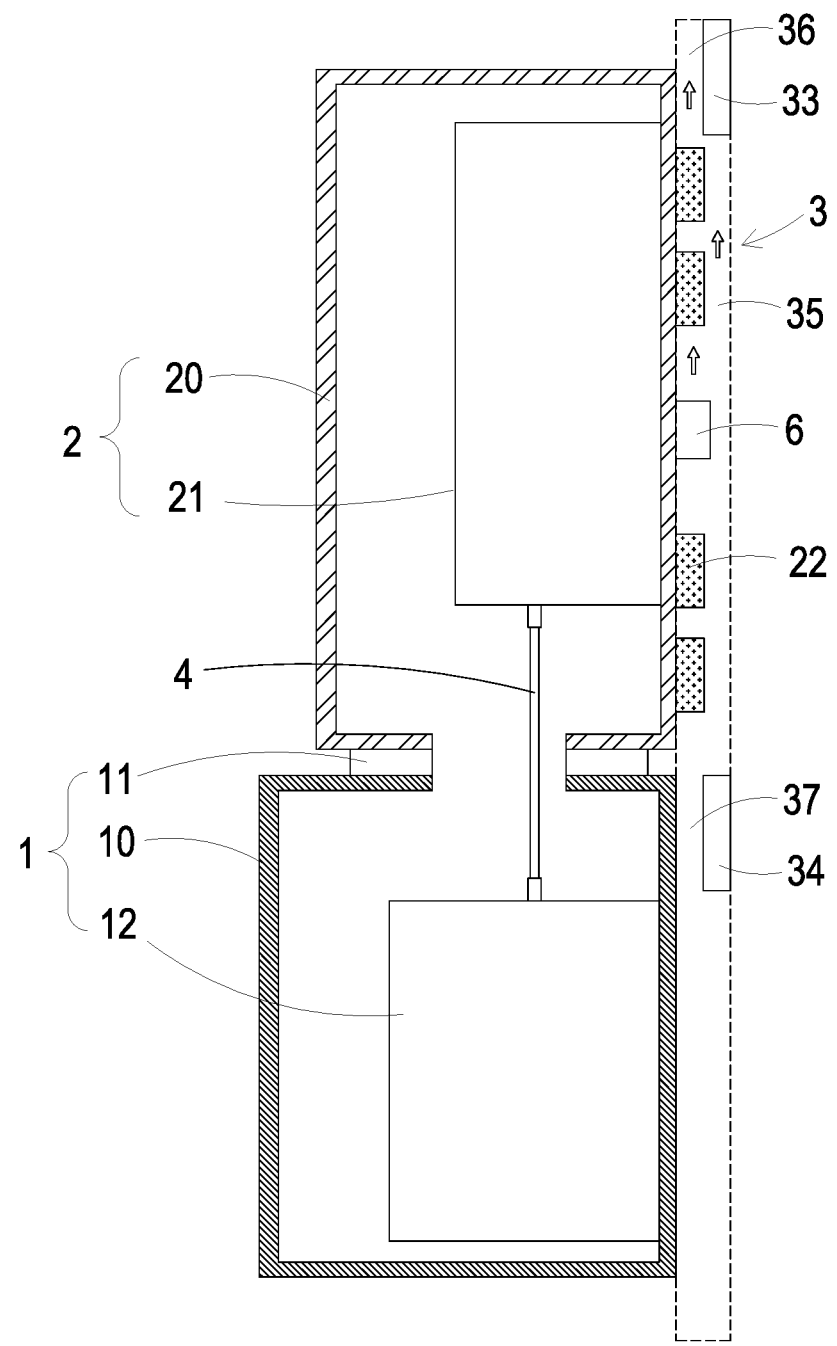
FIG. 6 is a schematic cross-sectional view illustrating the charging pile of FIG. 5 and taken along the line B-B.

FIG. 5 is a schematic perspective view illustrating a rear of the charging pile of FIG. 1. FIG. 6 is a schematic cross-sectional view illustrating the charging pile of FIG. 5 and taken along the line B-B. As shown in FIGS. 5 and 6, in some embodiments, the supporting device 3 includes a first pillar 31, a second pillar 32, a first transverse bar 33 and a second transverse bar 34. Each of the first transverse bar 33 and the second transverse bar 34 is connected with the first pillar 31 and the second pillar 32 and located between the first pillar 31 and the second pillar 32. A hollow portion 35 is defined by the first pillar 31, the second pillar 32, the first transverse bar 33 and the second transverse bar 34. In addition, the first transverse bar 33 has a first concave 36, and the second transverse bar 34 has a second concave 37. The first concave 36 and the second concave 37 are in communication with the hollow portion 35. The first housing 10 of the control module 1 and the second housing 20 of the power module 2 are both fixed on the first pillar 31 and the second pillar 32 of the supporting device 3, and an airflow channel is defined by the rear of the first housing 10, the rear of the second housing 20, the hollow portion 35, the first concave 36 and the second concave 37. The openings formed by the first concave 36 and the second concave 37 are the inlet and outlet of the airflow channel.

Please refer to FIGS. 5 and 6 again. In the embodiment, the power module 2 further includes a plurality of heat-dissipating fins 22. The plurality of heat-dissipating fins 22 are disposed on the rear of the second housing 20. When the power module 2 is fixed on the supporting device 3 by fastening, the plurality of heat-dissipating fins 22 are corresponding in position to the hollow portion 35 of the supporting device 3. By employing the plurality of heat-dissipating fins 22, the heat-dissipating area of the power module 2 is increased, and the heat dissipation efficiency of the charging pile 100 is improved. In some other embodiments, the charging pile 100 further includes a fan 6. The fan 6 is disposed on the rear of the second housing 20 of the power module 2 and is adjacent to the plurality of heat-dissipating fins 22. When the power module 2 is fixed on the supporting device 3 by fastening, the fan 6 disposed on the rear of the second housing 20 is corresponding in position to the hollow portion 35 of the supporting device 3. By employing the fan 6 to generate airflow, the airflow flows along the airflow channel and is accelerated to flow through the plurality of heat-dissipating fins 22. Consequently, the heat dissipation performance of the charging pile 100 is achieved by employing an active heat dissipation mechanism. It is emphasized that the quantity and installation position of the fan 6 and the direction of the airflow to be driven are not limited to the foregoing embodiments, and may be varied according to the practical requirements. In some embodiments, the charging pile 100 further includes a fireproof shell or a decorative shell (not shown). The fireproof shell or the decorative shell covers both of the control module 1 and the power module 2, so that the effect of fire prevention or decoration is achieved. Moreover, when the charging pile 100 is installed outdoors with a fire or extreme environmental temperature occurs, the charging pile 100 can be prevented from being damaged due to high temperature or low temperature.

Figure 7:
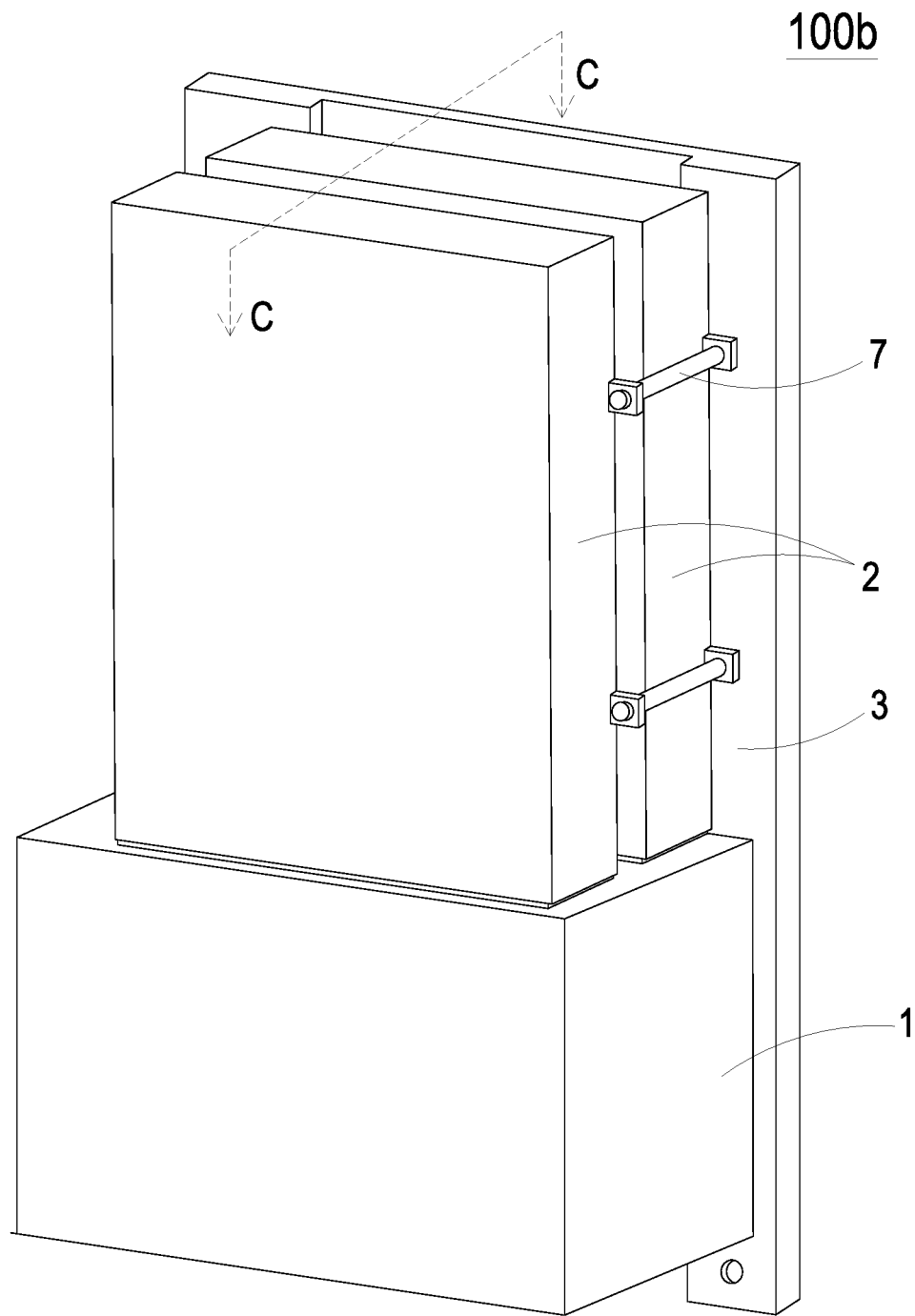
FIG. 7 is a schematic perspective view illustrating the charging pile according to a third embodiment of the present disclosure.
Figure 8:
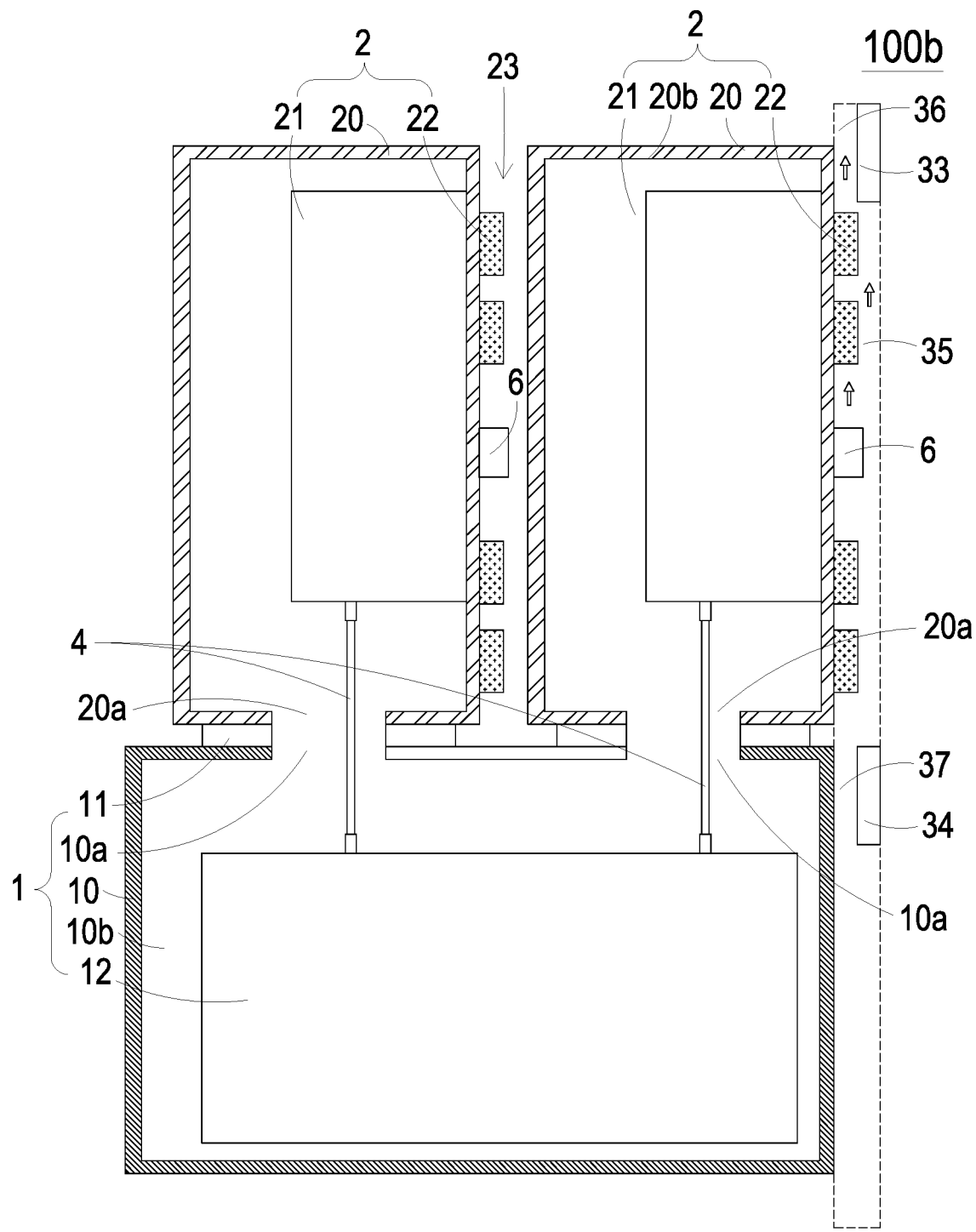
FIG. 8 is a schematic cross-sectional view illustrating the charging pile of FIG. 7 and taken along the line C-C.

FIG. 7 is a schematic perspective view illustrating the charging pile according to a third embodiment of the present disclosure. FIG. 8 is a schematic cross-sectional view illustrating the charging pile of FIG. 7 and taken along the line C-C. As shown in FIGS. 7 and 8, the structures and functions of the charging pile 100b of this embodiment are similar to those of the charging pile 100 shown in FIGS. 1 and 2. Component parts and elements corresponding to those of the first embodiment are designated by identical numeral references, and detailed descriptions thereof are omitted. Different from the charging pile 100 shown in FIGS. 1 and 2, the charging pile 100b of this embodiment includes a plurality of modular power modules 2 and a modular control module 1. The plurality of power modules 2 have same structures, functions and sizes, and each of the power modules 2 can provide a specific level of output power. The control module 1 includes a plurality of waterproof devices 11, and the first housing 10 has a plurality of first openings 10a. In some embodiments, the quantity of the power modules 2, the waterproof devices 11 of the control module 1 and the first openings 10a of the first housing 10 are the same. In this embodiment, the charging pile 100b includes two power modules 2, the control module 1 includes two waterproof devices 11, and the first housing 10 includes two first openings 10a. Each of the power modules 2 presses against the control module 1 by gravity, so that the second opening 20a of the second housing 20 of each power module 2 is corresponding in position to and in communication with the corresponding first opening 10a of the first housing 10 of the control module 1. The power supply unit 21 of each power module 2 is electrically coupled with the control unit 12 of the control module 1 by the corresponding cable 4 passing through the corresponding first opening 10a and second opening 20a. Since the power modules 2 press against the control module 1 by gravity, respectively, the waterproof devices 11 of the control module 1 are compressed between the first housing 10 and the second housings 20 by the gravity of the plurality of power modules 2 so as to achieve the effect of waterproof. In some embodiments, the two power modules 2 are adjacent and arranged in parallel on the control module 1. The control module 1 is fixed on the supporting device 3, and the two power modules 2, which are adjacent and arranged in parallel, can be fixed to the supporting device 3 together by using, for example but not limited to, a plurality of studs 7. Accordingly, the charging pile 100b of the present disclosure can fix the waterproof devices 11 between the control module 1 and the two power modules 2 by screwless way and at least IP55 waterproofing and foreign object protection level performance is achieved. Moreover, there is no additional locking portion and locking hole disposed on the first housing 10 of the control module 1 and the second housing 20 of the power module 2 to assemble the waterproof device 11. Consequently, the advantages of simplifying the structure, assembling and disassembling easily and improving the waterproof efficiency are achieved.

In the embodiment, the two power modules 2 are detachably connected to the control module 1. Since the control module 1 and the power module 2 are modular structures, respectively, the user can assemble two power modules 2 with the same or different output powers on the control module 1 according to the power demand so as to provide the required output power. For example, while a single power module 2 is employed, the charging pile 100 can provide an output power of 20 W. While two power modules 2 are employed, the charging pile 100b can provide an output power of 40 W. Accordingly, the quantity of the power modules 2 can be expanded according to the practical requirements so as to provide the required output power. It should be emphasized that the quantity of the power modules 2, the waterproof devices 11 of the control module 1 and the first openings 10a of the first housing 10 are not limited to the foregoing embodiments, and may be varied according to the practical requirements.

In the embodiment, the structures and functions of the supporting device 3, the airflow channel formed by the control module 1, the power module 2 and the supporting device 3, the heat-dissipating fins 22 of the power module 2 and the fan 6 are similar to that of the device of the charging pile as shown in FIGS. 5 and 6, and detailed descriptions thereof are omitted. In some embodiments, the two power modules 2, which are adjacent and arranged in parallel, are connected together and then fixed on the supporting device 3 by using a plurality of studs 7. The two power modules 2 are spaced apart with a gap 23. Under this circumstance, the heat-dissipating fins 22 and the fan 6 of the power module 2 can be accommodated in the gap 23 so as to improve the heat dissipation efficiency of the charging pile 100b.

In summary, the present disclosure provides a charging pile. The charging pile includes at least one modular power module and a modular control module so that the advantages of simplifying the structure, reducing the cost of production and maintenance, reducing the time of production, assembly and maintenance, and improving the heat dissipation efficiency are achieved. Moreover, the charging pile can be expanded according to requirements of output power, so that additional time and costs of redesigning are avoided and the scope of application is expanded. In addition, the charging pile further includes a waterproof device which is compressed and disposed between the control module and the power module, and is surrounding around the periphery of the openings of the control module and the power module, so that the advantages of improving the waterproof efficiency, simplifying the structure and reducing the time of production, assembly and maintenance are achieved.

While the disclosure has been described in terms of what is presently considered to be the most practical and preferred embodiments, it is to be understood that the disclosure needs not be limited to the disclosed embodiment.

What is claimed is:

1. A charging pile, comprising:
    a supporting device;
    a control module fixed on the supporting device, and comprising a first housing, a control unit and at least one waterproof device, wherein the first housing has at least one first opening, the control unit is disposed within the first housing, and the at least one waterproof device is disposed on and surrounding around the periphery of the at least one first opening; and
    at least one power module fixed on the supporting device, and disposed on the top of the control module, wherein each of the at least one power module comprises a second housing and a power supply unit, the second housing has at least one second opening, and the power supply unit is disposed within the second housing;
    wherein, the at least one second opening of the second housing is in communication with the at least one first opening of the first housing, the control unit is electrically coupled with the power supply unit of each of the at least one power module, and the at least one waterproof device is disposed between the first housing and the second housing, and is surrounding around the periphery of the at least one first opening and the periphery of the at least one second opening.

2. The charging pile according to claim 1, wherein the control module and the at least one power module are modular structures, respectively.

3. The charging pile according to claim 1, further comprising at least one cable, wherein the control unit is electrically coupled with the power supply unit by the at least one cable passing through the at least one first opening and the at least one second opening.

4. The charging pile according to claim 1, wherein the control module and the at least one power module are fixed on the supporting device by at least one fastening element.

5. The charging pile according to claim 1, wherein the at least one waterproof device is a flexible waterproof gasket, wherein the at least one power module presses against the at least one waterproof device by gravity, and the at least one waterproof device is compressed to be deformed, so as to fix the at least one waterproof device between the first housing and second housing.

6. The charging pile according to claim 1, wherein the first housing further comprises a protrusion, and the protrusion is disposed along the periphery of the first opening and extended outwardly from the first housing, wherein the protrusion has a platform, and the at least one waterproof device is disposed on the platform of the protrusion.

7. The charging pile according to claim 6, wherein the at least one waterproof device comprises:
    an engaging part engaged with the platform of the protrusion;
    a buffer part having a hollow structure, wherein the buffer part is compressed and deformed as the power module presses against the waterproof device by the gravity;
    at least one extension part extended outwardly from the top of the buffer part, and configured to contact with the second housing of the power module; and
    a recess located on the top of the buffer part, and adjacent to the at least one extension part.

8. The charging pile according to claim 1, wherein the supporting device comprises:
    a first pillar;
    a second pillar;
    a first transverse bar connected between the first pillar and the second pillar, and having a first concave; and
    a second transverse bar connected between the first pillar and the second pillar, and having a second concave, wherein a hollow portion is defined by the first pillar, the second pillar, the first transverse bar and the second transverse bar, and the first concave and the second concave are in communication with the hollow portion;
    wherein an airflow channel is defined by the rear of the first housing, the rear of the second housing, the hollow portion, the first concave and the second concave.

9. The charging pile according to claim 8, wherein the power module further comprises a plurality of heat-dissipating fins, which are disposed on the rear of the second housing and corresponding in position to the hollow portion of the supporting device.

10. The charging pile according to claim 9, further comprising a fan, which is disposed on the rear of the second housing and corresponding in position to the hollow portion of the supporting device.

11. The charging pile according to claim 1, wherein the at least one power module comprises a plurality of power modules, the plurality of power modules are adjacent and arranged in parallel on the control module, wherein the at least one waterproof device comprises a plurality of waterproof devices, and the first housing of control module comprises a plurality of first openings, wherein the second opening of the second housing of each of the plurality of power modules is in communication with the corresponding first opening of the first housing, and each of the plurality of waterproof devices is disposed between the second housing of the corresponding power module and the first housing of the control module.

12. The charging pile according to claim 11, further comprising a plurality of studs, wherein the plurality of power modules are connected with together and fixed on the supporting device by the plurality of studs, wherein any two adjacent power modules are spaced apart with a gap.

* * * * *